(12) United States Patent
Hua et al.

(10) Patent No.: US 10,720,390 B2
(45) Date of Patent: Jul. 21, 2020

(54) OHMIC METAL STRUCTURE FOR GAN DEVICE

(71) Applicant: WIN Semiconductors Corp., Tao Yuan (TW)

(72) Inventors: Chang-Hwang Hua, Tao Yuan (TW); Yi-Wei Lien, Tao Yuan (TW)

(73) Assignee: WIN SEMICONDUCTORS CORP., Tao Yuan (TW)

( * ) Notice: Subject to any disclaimer, the term of this patent is extended or adjusted under 35 U.S.C. 154(b) by 0 days.

(21) Appl. No.: 15/822,728

(22) Filed: Nov. 27, 2017

(65) Prior Publication Data

US 2019/0131244 A1 May 2, 2019

(30) Foreign Application Priority Data

Oct. 30, 2017 (TW) .............................. 106137435 A

(51) Int. Cl.
| | |
|---|---|
| H01L 23/532 | (2006.01) |
| H01L 29/20 | (2006.01) |
| H01L 21/02 | (2006.01) |
| H01L 29/45 | (2006.01) |
| H01L 29/778 | (2006.01) |

(52) U.S. Cl.
CPC .. H01L 23/53266 (2013.01); H01L 21/02304 (2013.01); H01L 29/2003 (2013.01); H01L 29/452 (2013.01); H01L 29/778 (2013.01)

(58) Field of Classification Search
CPC ................................ H01L 33/00; H01L 21/28
USPC ........................................... 257/745; 438/172
See application file for complete search history.

(56) References Cited

U.S. PATENT DOCUMENTS

| | | | | |
|---|---|---|---|---|
| 2002/0179932 A1* | 12/2002 | Shibata | ............. | H01L 21/02378 257/194 |
| 2004/0124435 A1* | 7/2004 | D'Evelyn | ............... | C30B 25/02 257/103 |
| 2005/0051804 A1* | 3/2005 | Yoshida | .............. | H01L 29/7787 257/213 |
| 2007/0200129 A1* | 8/2007 | Watanabe | ............... | H01L 33/40 257/99 |
| 2008/0042159 A1* | 2/2008 | Eitoh | ...................... | H01L 33/42 257/103 |
| 2009/0184329 A1* | 7/2009 | Miki | ..................... | H01L 33/405 257/79 |
| 2009/0267114 A1* | 10/2009 | Nakayama | ........ | H01L 29/66462 257/192 |

(Continued)

*Primary Examiner* — Sheng-Bai Zhu

(74) *Attorney, Agent, or Firm* — Muncy, Geissler, Olds & Lowe, P.C.

(57) ABSTRACT

An ohmic metal for GaN device comprises a diffusion barrier seed metal layer and a plurality of metal layers. The diffusion barrier seed metal layer is formed on an epitaxial structure layer. The diffusion barrier seed metal layer is made of Pt. The epitaxial structure layer is made of AlGaN or GaN. The plurality of metal layers is formed on the diffusion barrier seed metal layer. The plurality of metal layers comprises a first metal layer and a second metal layer. The first metal layer is formed on the diffusion barrier seed metal layer. The first metal layer is made of Ti. The second metal layer is formed on the first metal layer. The second metal layer is made of Al. By the diffusion barrier seed metal layer, so as to suppress the diffusion of the plurality of metal layers into the epitaxial structure layer.

7 Claims, 9 Drawing Sheets

(56) References Cited

U.S. PATENT DOCUMENTS

2009/0315150 A1* 12/2009 Hirota ............... C30B 19/00
257/615
2015/0364330 A1* 12/2015 Chen ............... H01L 21/28575
257/76

* cited by examiner

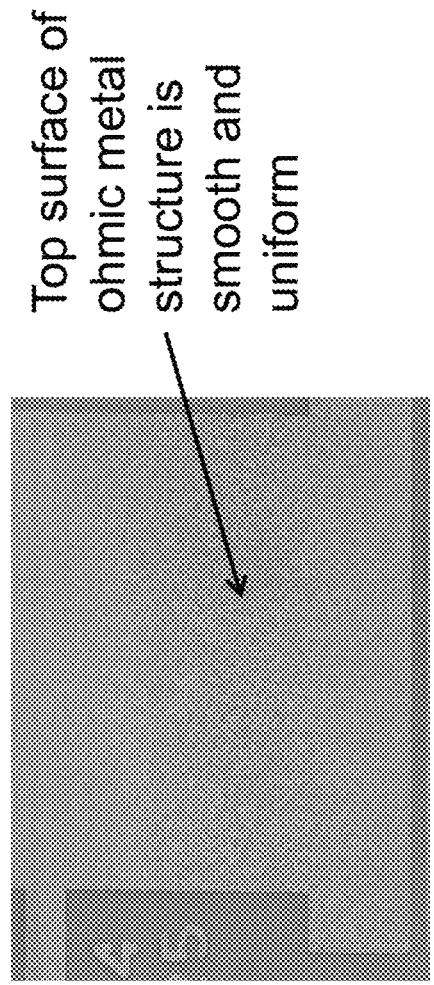
Figure 4A — Top surface of ohmic metal structure is smooth and uniform
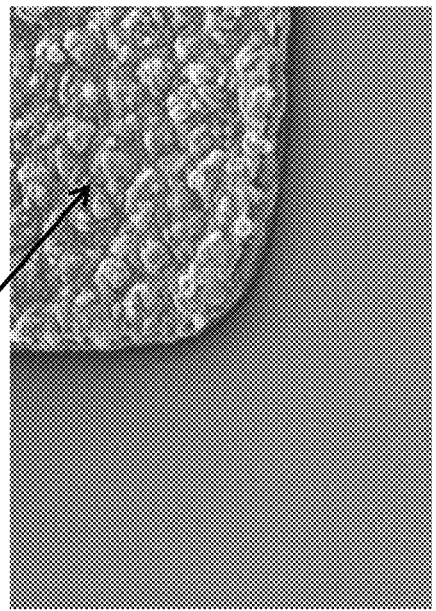
Figure 4B — Ohmic metal is more smooth and uniform
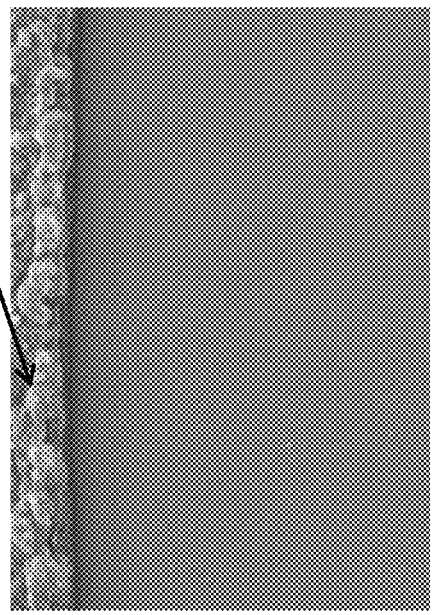
Figure 4C — There is no protrusion beyond the edge of ohmic metal

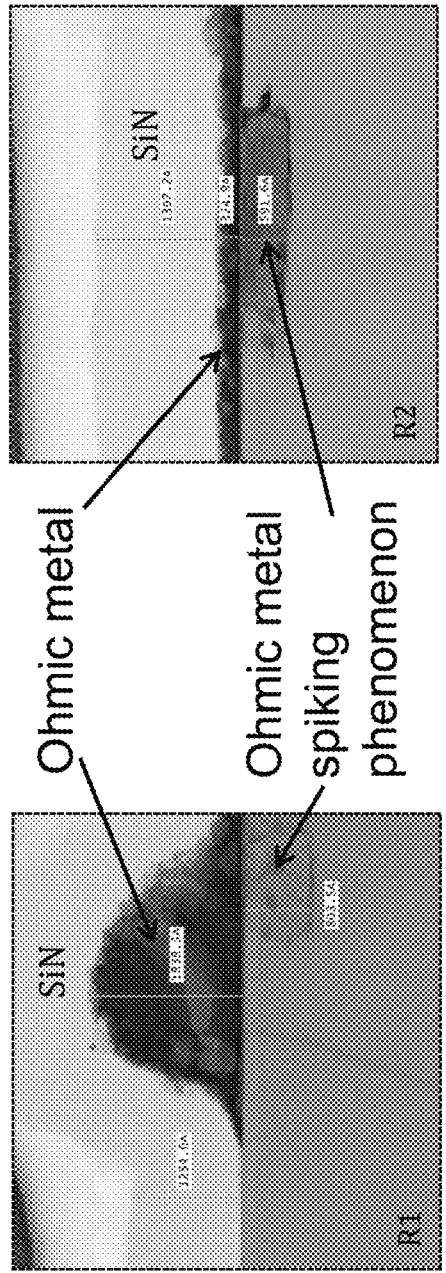
Figure 7D (Prior Art)
Figure 7E (Prior Art)
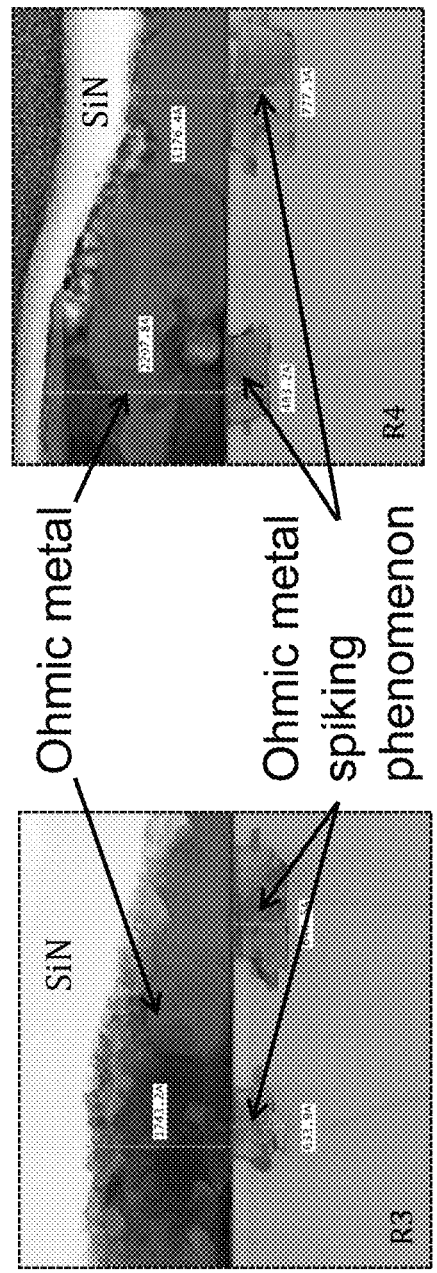
Figure 7F (Prior Art)
Figure 7G (Prior Art)

OHMIC METAL STRUCTURE FOR GAN DEVICE

FIELD OF THE INVENTION

The present invention relates to an ohmic metal structure for GaN device, especially an ohmic metal structure having a diffusion barrier seed layer for GaN device.

BACKGROUND OF THE INVENTION

Please refer to FIG. 5, which is the cross-sectional schematic showing an embodiment of the ohmic metal for GaN device of conventional technology. The ohmic metal 9 for GaN device of conventional technology comprises a first metal layer 91, a second metal layer 92, a third metal layer 93 and a fourth metal layer 94. The first metal layer 91 is formed on an AlGaN/GaN epitaxial structure layer 90 by physical vapor deposition (PVD), wherein the first metal layer 91 is made of Ti. The second metal layer 92 is formed on the first metal layer 91 by physical vapor deposition, wherein the second metal layer 92 is made of Al. The third metal layer 93 is formed on the second metal layer 92 by physical vapor deposition, wherein the third metal layer 93 is made of Ni, Ti or Mo. The fourth metal layer 94 is formed on the third metal layer 93 by physical vapor deposition, wherein the fourth metal layer 94 is made of Au. The ohmic metal 9 for GaN device of conventional technology (including the first metal layer 91, the second metal layer 92, the third metal layer 93 and the fourth metal layer 94) further needs a rapid thermal annealing (RTP) process treatment, wherein a rapid thermal annealing temperature of the rapid thermal annealing process and a rapid thermal annealing time of the rapid thermal annealing process are related to the material of the ohmic metal 9 and the thickness of the ohmic metal 9. In an embodiment, the ohmic metal 9 has the same structure as the ohmic metal 9 for GaN device of conventional technology in FIG. 5. The first metal layer 91, the second metal layer 92, the third metal layer 93 and the fourth metal layer 94 of the ohmic metal 9 are made of Ti, Al, Ni, Au respectively. The thicknesses of the first metal layer 91, the second metal layer 92, the third metal layer 93 and the fourth metal layer 94 of the ohmic metal 9 are 20 nm, 100 nm, 55 nm and 55 nm respectively. In current embodiment, the rapid thermal annealing temperature of the rapid thermal annealing process is between 880° C.~925° C. The rapid thermal annealing time of the rapid thermal annealing process is between 20 seconds~60 seconds. The disadvantage of current embodiment is that the breakdown voltage of the GaN field effect transistor (FET) having the ohmic metal 9 is about 120V. And the values of the breakdown voltage of the GaN field effect transistors are widely distributed. However for a high energy density GaN field effect transistor application, the breakdown voltage is required to be higher. And the values of the breakdown voltage of the GaN field effect transistors cannot be widely distributed to ensure the values of the breakdown voltage fall within the specifications.

In another embodiment, the ohmic metal 9 has the same structure as the ohmic metal 9 for GaN device of conventional technology in FIG. 5. The first metal layer 91, the second metal layer 92, the third metal layer 93 and the fourth metal layer 94 of the ohmic metal 9 are made of Ti, Al, Ti, Au respectively. The thicknesses of the first metal layer 91, the second metal layer 92, the third metal layer 93 and the fourth metal layer 94 of the ohmic metal 9 are 20 nm, 100 nm, 55 nm and 55 nm respectively. In current embodiment, the rapid thermal annealing temperature of the rapid thermal annealing process is between 845° C.~875° C. The rapid thermal annealing time of the rapid thermal annealing process is between 20 seconds~60 seconds. Please refer to FIG. 6A, which is the top view of the SEM image of an embodiment of the ohmic metal (Ti/Al/Ti/Au) for GaN device of conventional technology. In FIG. 6A, it is obviously that a top surface of the ohmic metal is non-uniform, rough and not smooth. Please also refer to FIGS. 6B and 6C, which are the partial enlarged views of the SEM image of the embodiment of FIG. 6A. In FIG. 6B, it is clear that the top surface of the ohmic metal not only presents non-uniform, but also presents serious protrusion and depression. In FIG. 6C, the ohmic metal also presents non-uniform and even presents protrusion beyond the edge. Please also refer to FIG. 6D~6F, which are the cross-sectional views of the FIB (focused ion beam) image of three embodiments of the ohmic metal (Ti/Al/Ti/Au) for GaN device of conventional technology. These three embodiments show the partial cross-sectional views of three GaN field effect transistors. Firstly the three GaN field effect transistors are polished by cross-section polish, and then the three GaN field effect transistors are scanned over by the focused ion beam for generating the image. The S1, S2 and S3 regions of the three embodiments all present serious tumor at the edge of the ohmic metal. The phenomenon is consistent with the phenomenon of protrusion and depression observed in FIG. 6B. Therefore, the disadvantages of the embodiments of conventional technology are that after the rapid thermal annealing process treatment, the top surface of the ohmic metal becomes very non-uniform and generates serious tumor at the edge of the ohmic metal. These drawbacks will affect the characteristics of the GaN devices having the ohmic metal for GaN device of conventional technology and affect the result of the reliability test of the GaN devices having the ohmic metal for GaN device of conventional technology.

In another embodiment, the ohmic metal 9 has the same structure as the ohmic metal 9 for GaN device of conventional technology in FIG. 5. The first metal layer 91, the second metal layer 92, the third metal layer 93 and the fourth metal layer 94 of the ohmic metal 9 are made of Ti, Al, Mo, Au respectively. The thicknesses of the first metal layer 91, the second metal layer 92, the third metal layer 93 and the fourth metal layer 94 of the ohmic metal 9 are 15 nm, 75 nm, 40 nm and 55 nm respectively. In current embodiment, the rapid thermal annealing temperature of the rapid thermal annealing process is 865° C. The rapid thermal annealing time of the rapid thermal annealing process is between 20 seconds~60 seconds. Please refer to FIG. 7A, which is the top view of the SEM image of an embodiment of the ohmic metal (Ti/Al/Mo/Au) for GaN device of conventional technology. Please also refer to FIG. 7B, which is the cross-sectional view of the TEM image along the broken line of the arrow of the embodiment of FIG. 7A. Firstly the embodiment is polished by cross-section polish, and then the embodiment is scanned over by transmission electron microscopy for generating the image. In FIG. 7B, the ohmic metal (the left side and the right side) is covered by a silicon nitride layer. The ohmic metal (the left side and the right side) presents very non-uniform. Please also refer to FIG. 7C, which is the partial enlarged view of the TEM image of the block R region of the embodiment of FIG. 7B. Obviously, the ohmic metal is very non-flatly distributed. Furthermore, there exists the ohmic metal spiking phenomenon. Please also refer to FIGS. 7D, 7E, 7F and 7G, which are the partial enlarged views of the TEM image of the block R1, R2, R3 and R4 regions of the embodiment of FIG. 7C respectively. The ohmic metal in each of the R1, R2, R3 and R4 regions of the embodiment is very non-uniform. Moreover, the ohmic metal spiking phenomenon extends downward to the AlGaN/GaN epitaxial structure layer 90. Hence, the disadvantages of the embodiment of conventional technology are that, after the rapid thermal annealing process treatment, the ohmic metal is very non-uniform and there exists the ohmic metal spiking phenomenon. These drawbacks will affect the characteristics of the GaN devices having the ohmic metal for GaN device of conventional technology and affect the result of the reliability test of the GaN devices having the ohmic metal for GaN device of conventional technology.

Accordingly, the present invention has developed a new design which may avoid the above mentioned drawbacks, may significantly enhance the performance of the devices and may take into account economic considerations. Therefore, the present invention then has been invented.

SUMMARY OF THE INVENTION

The main technical problem that the present invention is seeking to solve is: how to suppress the diffusion of the ohmic metal into the AlGaN/GaN epitaxial structure so that the top surface of the ohmic metal presents smooth and uniform; the ohmic metal spiking phenomenon is prevented; there is no tumor at the edge of the ohmic metal; and the breakdown voltage of the GaN device is increased.

In order to solve the problems mentioned the above and to achieve the expected effect, the present invention provides an ohmic metal structure for GaN device, which comprises: a diffusion barrier seed layer and a plurality of metal layers. The diffusion barrier seed layer is formed on an epitaxial structure layer, wherein the diffusion barrier seed layer is made of Pt. The epitaxial structure layer is made of one material selected from the group consisting of: GaN and AlGaN. The plurality of metal layers is formed on the diffusion barrier seed layer. The plurality of metal layers comprises: a first metal layer and a second metal layer. The first metal layer is formed on the diffusion barrier seed layer, wherein the first metal layer is made of Ti. The second metal layer is formed on the first metal layer, wherein the second metal layer is made of Al. In the present invention, by providing the diffusion barrier seed layer, so as to suppress the diffusion of the plurality of metal layers into the epitaxial structure layer.

In an embodiment, the plurality of metal layers further comprises a third metal layer, wherein the third metal layer is formed on the second metal layer, wherein the third metal layer is made of one material selected from the group consisting of: Ni, Mo, Pd, Pt and Ti.

In an embodiment, the plurality of metal layers further comprises a fourth metal layer, wherein the fourth metal layer is formed on the third metal layer, wherein the fourth metal layer is made of Au.

In an embodiment, the fourth metal layer has a thickness greater than or equal to 100 Å and less than or equal to 1000 Å.

In an embodiment, the third metal layer has a thickness greater than or equal to 400 Å and less than or equal to 800 Å.

In an embodiment, the second metal layer has a thickness greater than or equal to 500 Å and less than or equal to 1500 Å.

In an embodiment, the first metal layer has a thickness greater than or equal to 50 Å and less than or equal to 250 Å.

In an embodiment, the diffusion barrier seed layer has a thickness greater than or equal to 50 Å and less than or equal to 250 Å.

In an embodiment, the diffusion barrier seed layer is formed on the epitaxial structure layer by physical vapor deposition.

In an embodiment, the ohmic metal structure is treated by a rapid thermal annealing process, wherein a rapid thermal annealing temperature of the rapid thermal annealing process is greater than or equal to 800° C. and less than or equal to 925° C.

In an embodiment, the ohmic metal structure is treated by a rapid thermal annealing process, a rapid thermal annealing time of the rapid thermal annealing process is greater than or equal to 20 seconds and less than or equal to 120 seconds.

For further understanding the characteristics and effects of the present invention, some preferred embodiments referred to drawings are in detail described as follows.

BRIEF DESCRIPTION OF DRAWINGS

FIG. 4A is the top view of the SEM image of an embodiment of the ohmic metal structure for GaN device of the present invention.

FIG. 4B is the partial enlarged view of the SEM image of the embodiment of FIG. 4A.

FIG. 4C is the partial enlarged view of the SEM image of the embodiment of FIG. 4A.

FIG. 7D is the partial enlarged view of the TEM image of the block R1 region of the embodiment of FIG. 7C.

FIG. 7E is the partial enlarged view of the TEM image of the block R2 region of the embodiment of FIG. 7C.

FIG. 7F is the partial enlarged view of the TEM image of the block R3 region of the embodiment of FIG. 7C.

FIG. 7G is the partial enlarged view of the TEM image of the block R4 region of the embodiment of FIG. 7C.

DETAILED DESCRIPTIONS OF PREFERRED EMBODIMENTS

Figure 1:
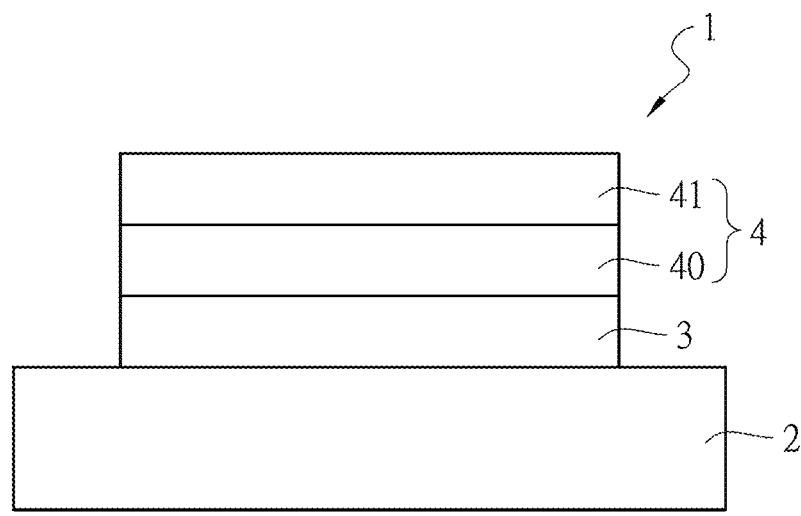
FIG. 1 is the cross-sectional schematic showing an embodiment of the ohmic metal structure for GaN device of the present invention.

Please refer to FIG. 1, which is the cross-sectional schematic showing an embodiment of the ohmic metal structure for GaN device of the present invention. The ohmic metal structure 1 for GaN device of the present invention comprises: a diffusion barrier seed layer 3 and a plurality of metal layers 4. The diffusion barrier seed layer 3 is formed on an epitaxial structure layer 2, wherein the diffusion barrier seed layer 3 is made of Pt. The epitaxial structure layer 2 is made of one material selected from the group consisting of: GaN and AlGaN. In a preferable embodiment, the diffusion barrier seed layer 3 is formed on the epitaxial structure layer 2 by physical vapor deposition (PVD). In a preferable embodiment, the diffusion barrier seed layer 3 has a thickness greater than or equal to 50 Å and less than or equal to 250 Å. The plurality of metal layers 4 is formed on the diffusion barrier seed layer 3. The plurality of metal layers 4 comprises a first metal layer 40 and a second metal layer 41. The first metal layer 40 is formed on the diffusion barrier seed layer 3, wherein the first metal layer 40 is made of Ti. In a preferable embodiment, the first metal layer 40 is formed on the diffusion barrier seed layer 3 by physical vapor deposition. In a preferable embodiment, the first metal layer 40 has a thickness greater than or equal to 50 Å and less than or equal to 250 Å. The second metal layer 41 is formed on the first metal layer 40, wherein the second metal layer 41 is made of Al. In a preferable embodiment, the second metal layer 41 is formed on the first metal layer 40 by physical vapor deposition. In a preferable embodiment, the second metal layer 41 has a thickness greater than or equal to 500 Å and less than or equal to 1500 Å. After forming the plurality of metal layers 4 on the diffusion barrier seed layer 3, a rapid thermal annealing (RTP) process treatment is needed, wherein a rapid thermal annealing temperature of the rapid thermal annealing process is greater than or equal to 800° C. and less than or equal to 925° C., wherein a rapid thermal annealing time of the rapid thermal annealing process is greater than or equal to 20 seconds and less than or equal to 120 seconds. In a preferable embodiment, the rapid thermal annealing temperature of the rapid thermal annealing process is greater than or equal to 850° C. and less than or equal to 925° C. In a preferable embodiment, the rapid thermal annealing time of the rapid thermal annealing process is greater than or equal to 20 seconds and less than or equal to 60 seconds. In the present invention, by providing the diffusion barrier seed layer 3, so as to suppress the diffusion of the plurality of metal layers 4 (including the first metal layer 40 and the second metal layer 41) into the epitaxial structure layer 2. The top surface of the ohmic metal structure 1 for GaN device of the present invention is smooth and uniform. The ohmic metal structure 1 is prevented from the ohmic metal spiking phenomenon and the tumor at the edge. Therefore, the breakdown voltage of the GaN device using the ohmic metal structure 1 of the present invention is increased.

In some embodiments, the diffusion barrier seed layer 3 has a thickness greater than or equal to 50 Å and less than or equal to 240 Å, greater than or equal to 50 Å and less than or equal to 230 Å, greater than or equal to 50 Å and less than or equal to 220 Å, greater than or equal to 50 Å and less than or equal to 210 Å, greater than or equal to 50 Å and less than or equal to 200 Å, greater than or equal to 50 Å and less than or equal to 190 Å, greater than or equal to 50 Å and less than or equal to 180 Å, greater than or equal to 50 Å and less than or equal to 170 Å, greater than or equal to 50 Å and less than or equal to 160 Å, greater than or equal to 50 Å and less than or equal to 150 Å, greater than or equal to 50 Å and less than or equal to 140 Å, greater than or equal to 50 Å and less than or equal to 130 Å, greater than or equal to 50 Å and less than or equal to 120 Å, greater than or equal to 60 Å and less than or equal to 250 Å, greater than or equal to 70 Å and less than or equal to 250 Å, greater than or equal to 80 Å and less than or equal to 250 Å, greater than or equal to 90 Å and less than or equal to 250 Å, greater than or equal to 100 Å and less than or equal to 250 Å, greater than or equal to 110 Å and less than or equal to 250 Å, greater than or equal to 120 Å and less than or equal to 250 Å, greater than or equal to 130 Å and less than or equal to 250 Å, greater than or equal to 140 Å and less than or equal to 250 Å, greater than or equal to 150 Å and less than or equal to 250 Å, greater than or equal to 160 Å and less than or equal to 250 Å, greater than or equal to 170 Å and less than or equal to 250 Å, or greater than or equal to 180 Å and less than or equal to 250 Å.

In some embodiments, the first metal layer 40 has a thickness greater than or equal to 50 Å and less than or equal to 240 Å, greater than or equal to 50 Å and less than or equal to 230 Å, greater than or equal to 50 Å and less than or equal to 220 Å, greater than or equal to 50 Å and less than or equal to 210 Å, greater than or equal to 50 Å and less than or equal to 200 Å, greater than or equal to 50 Å and less than or equal to 190 Å, greater than or equal to 50 Å and less than or equal to 180 Å, greater than or equal to 50 Å and less than or equal to 170 Å, greater than or equal to 50 Å and less than or equal to 160 Å, greater than or equal to 60 Å and less than or equal to 250 Å, greater than or equal to 70 Å and less than or equal to 250 Å, greater than or equal to 80 Å and less than or equal to 250 Å, greater than or equal to 90 Å and less than or equal to 250 Å, greater than or equal to 100 Å and less than or equal to 250 Å, greater than or equal to 110 Å and less than or equal to 250 Å, greater than or equal to 120 Å and less than or equal to 250 Å, greater than or equal to 130 Å and less than or equal to 250 Å, greater than or equal to 140 Å and less than or equal to 250 Å, or greater than or equal to 150 Å and less than or equal to 250 Å.

In some embodiments, the second metal layer 41 has a thickness greater than or equal to 500 Å and less than or equal to 1400 Å, greater than or equal to 500 Å and less than or equal to 1300 Å, greater than or equal to 500 Å and less than or equal to 1200 Å, greater than or equal to 500 Å and less than or equal to 1100 Å, greater than or equal to 500 Å and less than or equal to 1000 Å, greater than or equal to 500 Å and less than or equal to 900 Å, greater than or equal to 550 Å and less than or equal to 1500 Å, greater than or equal to 600 Å and less than or equal to 1500 Å, greater than or equal to 650 Å and less than or equal to 1500 Å, greater than or equal to 700 Å and less than or equal to 1500 Å, greater than or equal to 800 Å and less than or equal to 1500 Å, or greater than or equal to 900 Å and less than or equal to 1500 Å.

Figure 2:
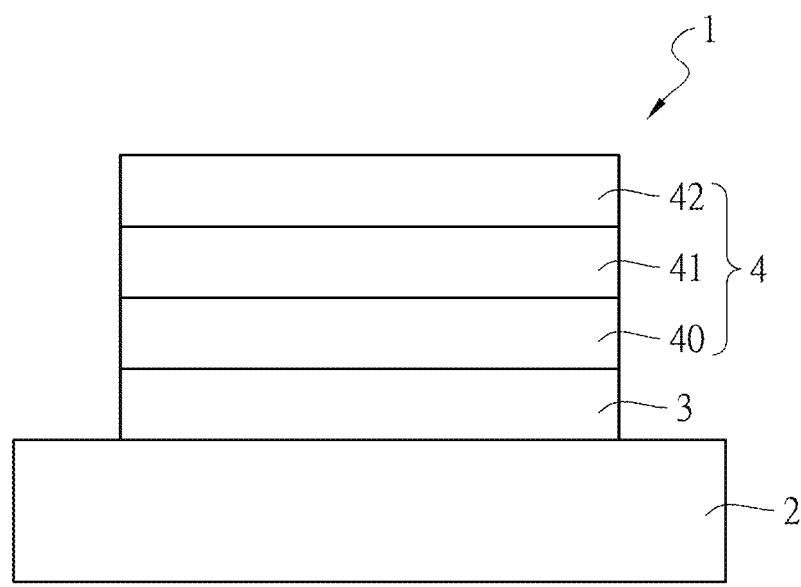
FIG. 2 is the cross-sectional schematic showing another embodiment of the ohmic metal structure for GaN device of the present invention.

Please refer to FIG. 2, which is the cross-sectional schematic showing another embodiment of the ohmic metal structure for GaN device of the present invention. The main structure of the embodiment of FIG. 2 is basically the same as the structure of the embodiment of FIG. 1, except that the plurality of metal layers 4 comprises a first metal layer 40, a second metal layer 41 and a third metal layer 42. The first metal layer 40 is formed on the diffusion barrier seed layer 3, wherein the first metal layer 40 is made of Ti. The second metal layer 41 is formed on the first metal layer 40, wherein the second metal layer 41 is made of Al. The third metal layer 42 is formed on the second metal layer 41, wherein the third metal layer 42 is made of one material selected from the group consisting of: Ni, Mo, Pd, Pt and Ti. In a preferable embodiment, the third metal layer 42 has a thickness greater than or equal to 400 Å and less than or equal to 800 Å. In a preferable embodiment, the third metal layer 42 is formed on the second metal layer 41 by physical vapor deposition. In the present invention, by providing the diffusion barrier seed layer 3, so as to suppress the diffusion of the plurality of metal layers 4 (including the first metal layer 40, the second metal layer 41 and the third metal layer 42) into the epitaxial structure layer 2. The top surface of the ohmic metal structure 1 for GaN device of the present invention is smooth and uniform. The ohmic metal structure 1 is prevented from the ohmic metal spiking phenomenon and the tumor at the edge. Therefore, the breakdown voltage of the GaN device using the ohmic metal structure 1 of the present invention is increased.

In some embodiments, the third metal layer 42 has a thickness greater than or equal to 400 Å and less than or equal to 770 Å, greater than or equal to 400 Å and less than or equal to 740 Å, greater than or equal to 400 Å and less than or equal to 700 Å, greater than or equal to 400 Å and less than or equal to 670 Å, greater than or equal to 400 Å and less than or equal to 640 Å, greater than or equal to 400 Å and less than or equal to 600 Å, greater than or equal to 430 Å and less than or equal to 800 Å, greater than or equal to 460 Å and less than or equal to 800 Å, greater than or equal to 500 Å and less than or equal to 800 Å, greater than or equal to 530 Å and less than or equal to 800 Å, greater than or equal to 560 Å and less than or equal to 800 Å, or greater than or equal to 600 Å and less than or equal to 800 Å.

Figure 3:
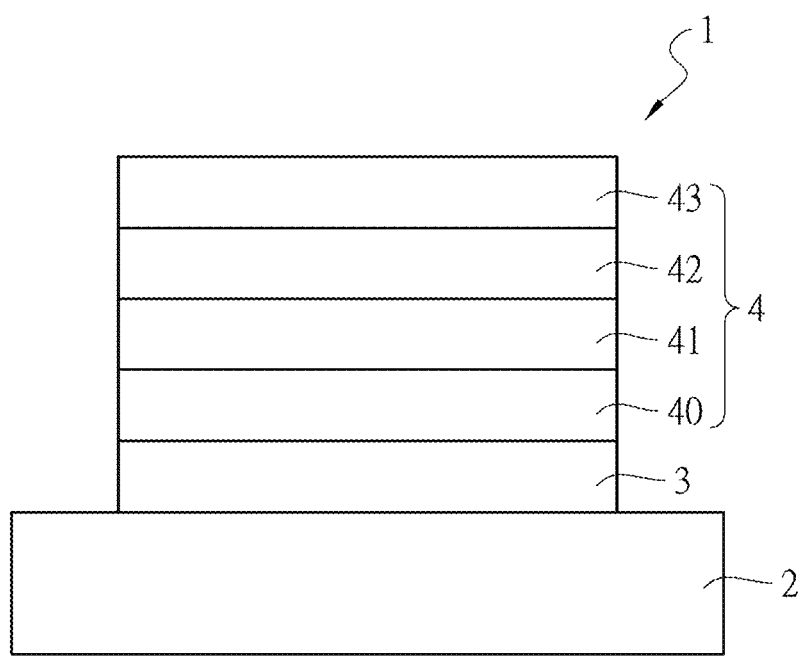
FIG. 3 is the cross-sectional schematic showing one embodiment of the ohmic metal structure for GaN device of the present invention.

Please refer to FIG. 3, which is the cross-sectional schematic showing one embodiment of the ohmic metal structure for GaN device of the present invention. The main structure of the embodiment of FIG. 3 is basically the same as the structure of the embodiment of FIG. 2, except that the plurality of metal layers 4 comprises a first metal layer 40, a second metal layer 41, a third metal layer 42 and a fourth metal layer 43. The first metal layer 40 is formed on the diffusion barrier seed layer 3, wherein the first metal layer 40 is made of Ti. The second metal layer 41 is formed on the first metal layer 40, wherein the second metal layer 41 is made of Al. The third metal layer 42 is formed on the second metal layer 41, wherein the third metal layer 42 is made of one material selected from the group consisting of: Ni, Mo, Pd, Pt and Ti. The fourth metal layer 43 is formed on the third metal layer 42, wherein the fourth metal layer 43 is made of Au. In a preferable embodiment, the fourth metal layer 43 has a thickness greater than or equal to 100 Å and less than or equal to 1000 Å. In a preferable embodiment, the fourth metal layer 43 is formed on the third metal layer 42 by physical vapor deposition. In the present invention, by providing the diffusion barrier seed layer 3, so as to suppress the diffusion of the plurality of metal layers 4 (including the first metal layer 40, the second metal layer 41, the third metal layer 42 and the fourth metal layer 43) into the epitaxial structure layer 2. The top surface of the ohmic metal structure 1 for GaN device of the present invention is smooth and uniform. The ohmic metal structure 1 is prevented from the ohmic metal spiking phenomenon and the tumor at the edge. Therefore, the breakdown voltage of the GaN device using the ohmic metal structure 1 of the present invention is increased.

In some embodiments, the fourth metal layer 43 has a thickness greater than or equal to 100 Å and less than or equal to 950 Å, greater than or equal to 100 Å and less than or equal to 900 Å, greater than or equal to 100 Å and less than or equal to 850 Å, greater than or equal to 100 Å and less than or equal to 800 Å, greater than or equal to 100 Å and less than or equal to 700 Å, greater than or equal to 100 Å and less than or equal to 600 Å, greater than or equal to 150 Å and less than or equal to 1000 Å, greater than or equal to 200 Å and less than or equal to 1000 Å, greater than or equal to 250 Å and less than or equal to 1000 Å, greater than or equal to 300 Å and less than or equal to 1000 Å, greater than or equal to 400 Å and less than or equal to 1000 Å, or greater than or equal to 500 Å and less than or equal to 1000 Å.

Figure 4D:
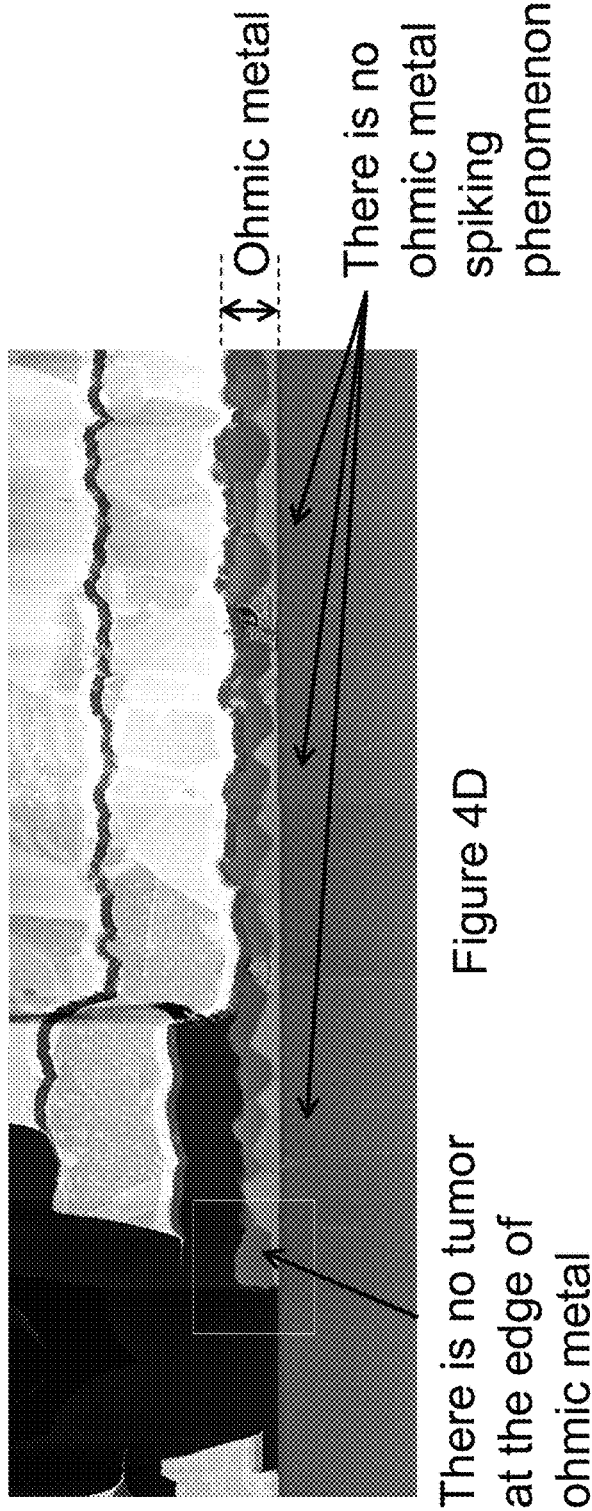
FIG. 4D is the cross-sectional view of the TEM image of another embodiment of the ohmic metal structure for GaN device of the present invention.
Figure 4E:
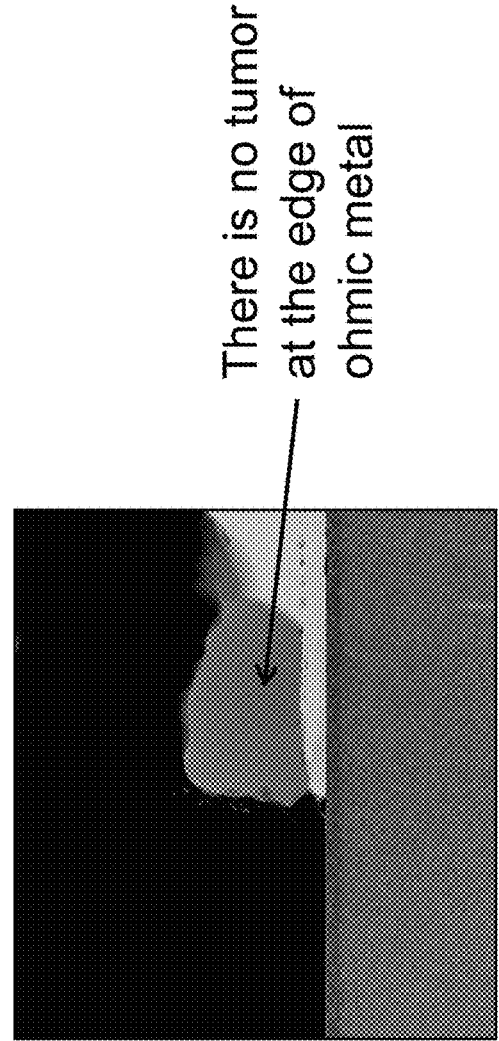
FIG. 4E is the partial enlarged view of the SEM image of the white block region of the embodiment of FIG. 4D.
Figure 5:
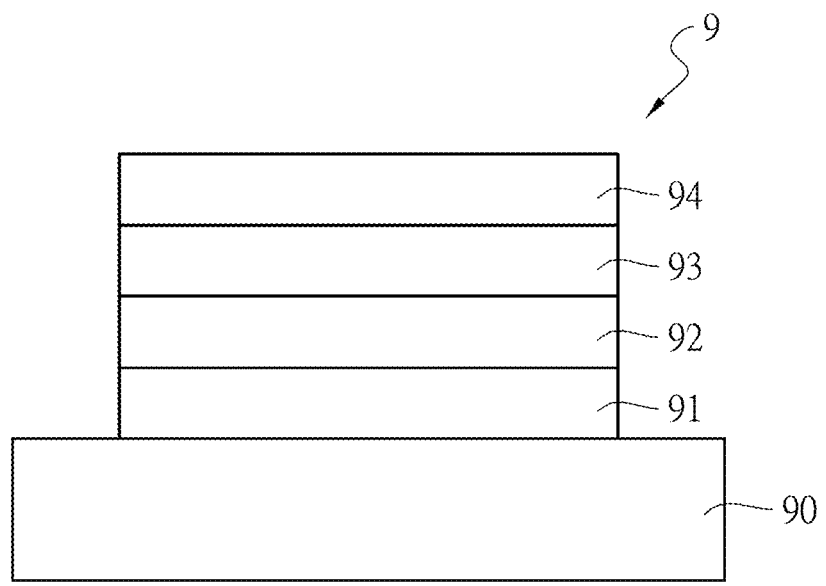
FIG. 5 is the cross-sectional schematic showing an embodiment of the ohmic metal for GaN device of conventional technology.
Figure 6A:
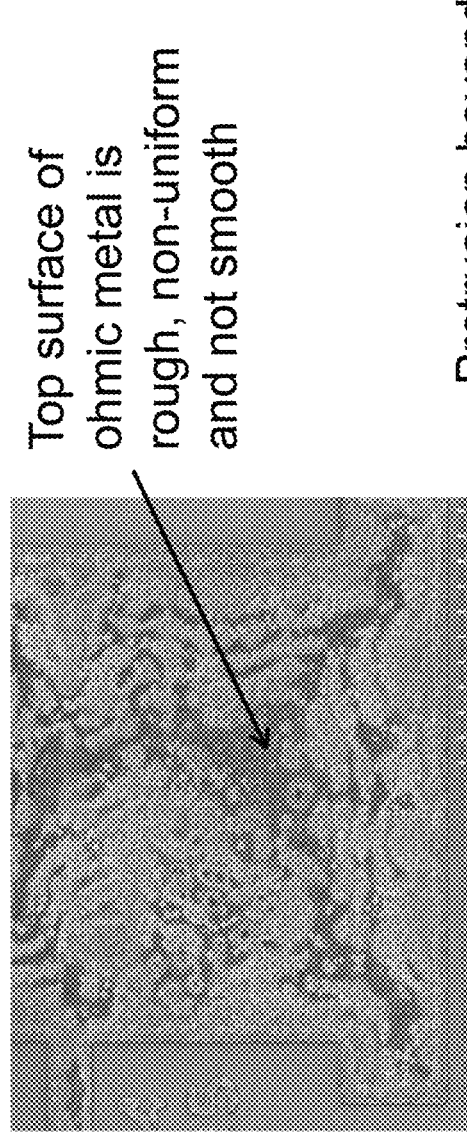
FIG. 6A is the top view of the SEM image of an embodiment of the ohmic metal (Ti/Al/Ti/Au) for GaN device of conventional technology.
Figure 6C:
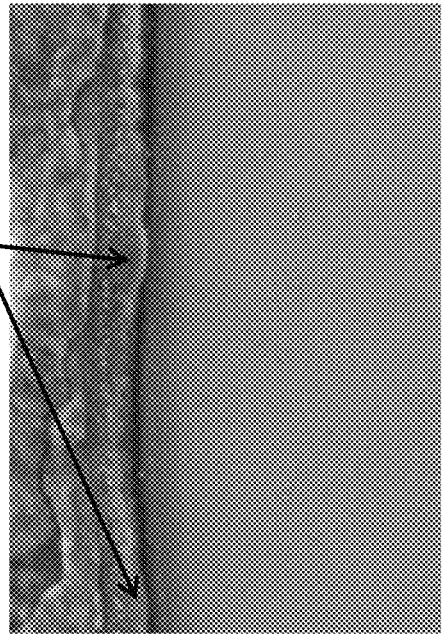
FIG. 6C is the partial enlarged view of the SEM image of the embodiment of FIG. 6A.
Figure 6B:
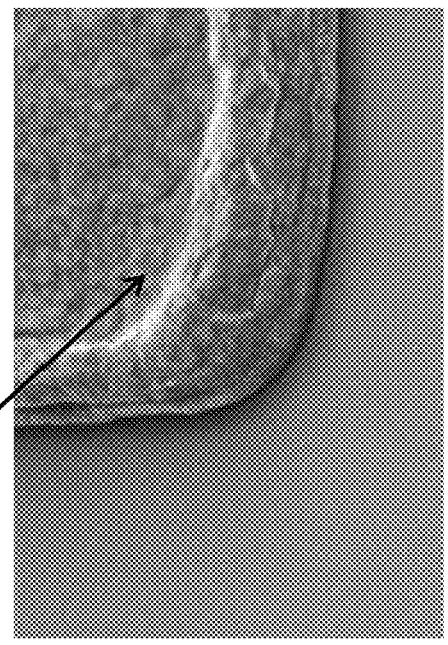
FIG. 6B is the partial enlarged view of the SEM image of the embodiment of FIG. 6A.
Figure 6D:
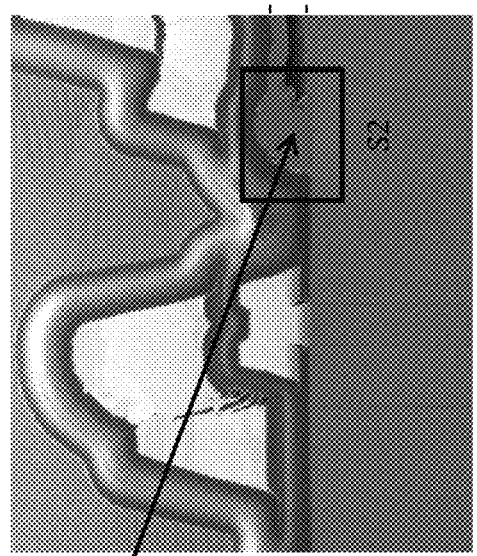
FIG. 6D is the cross-sectional view of the FIB image of an embodiment of the ohmic metal (Ti/Al/Ti/Au) for GaN device of conventional technology.
Figure 6E:
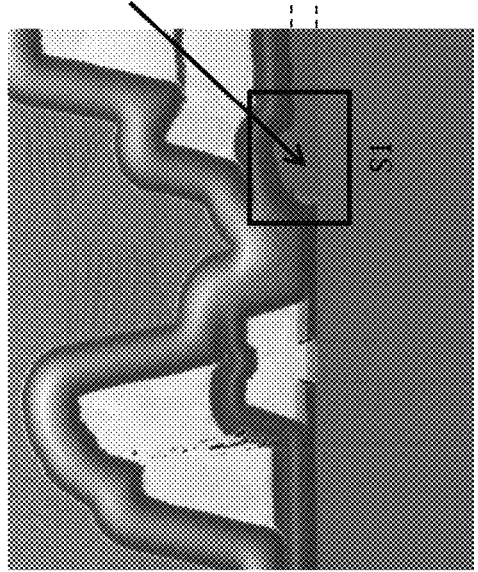
FIG. 6E is the cross-sectional view of the FIB image of another embodiment of the ohmic metal (Ti/Al/Ti/Au) for GaN device of conventional technology.
Figure 6F:
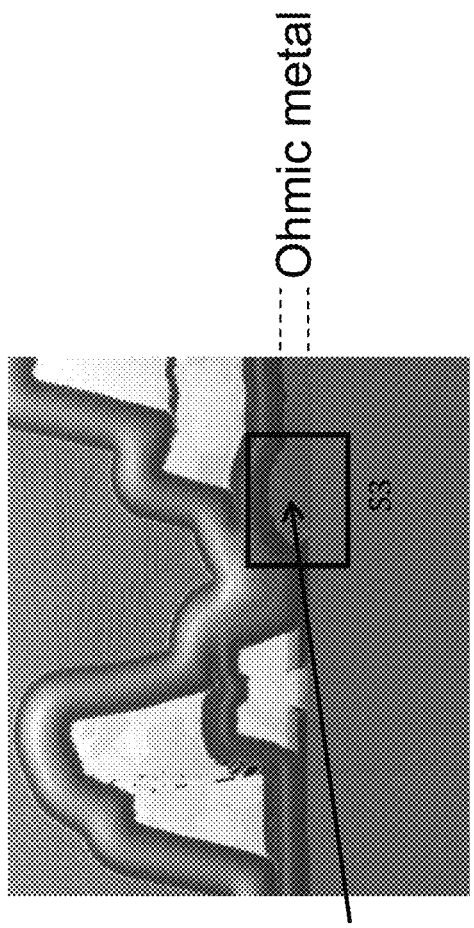
FIG. 6F is the cross-sectional view of the FIB image of one embodiment of the ohmic metal (Ti/Al/Ti/Au) for GaN device of conventional technology.
Figure 7A:
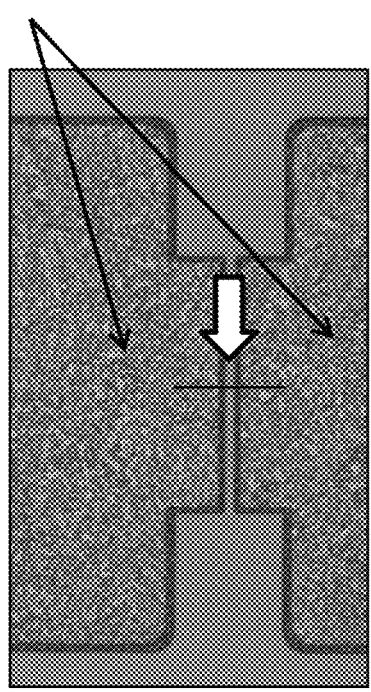
FIG. 7A is the top view of the SEM image of an embodiment of the ohmic metal (Ti/Al/Mo/Au) for GaN device of conventional technology.
Figure 7B:
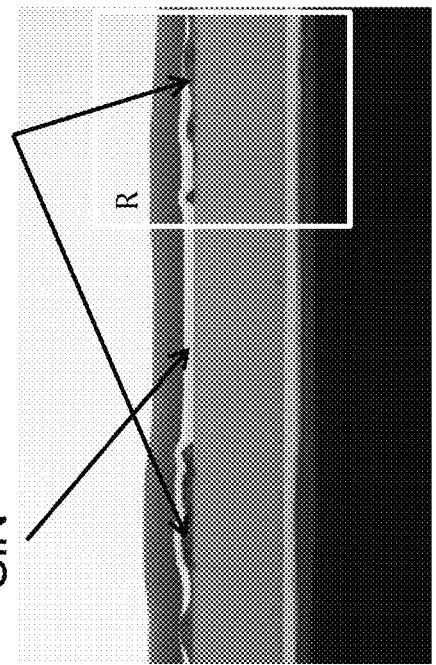
FIG. 7B is the cross-sectional view of the TEM image along the broken line of the arrow of the embodiment of FIG. 7A.
Figure 7C:
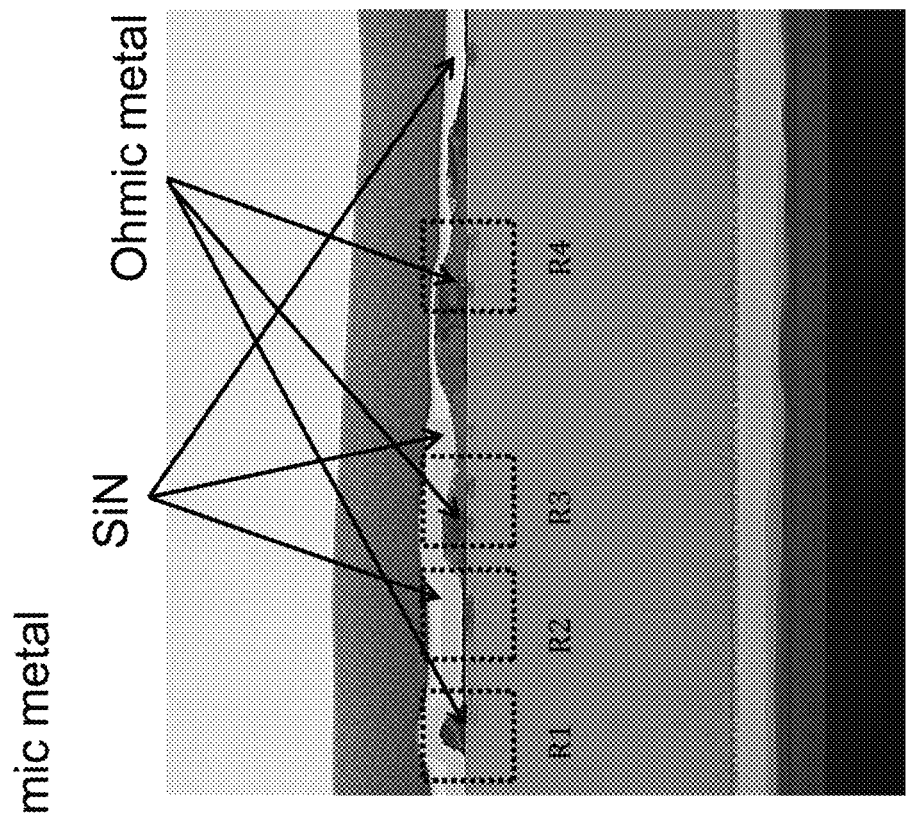
FIG. 7C is the partial enlarged view of the TEM image of the block R region of the embodiment of FIG. 7B.

Please refer to FIG. 4A, which is the top view of the SEM image of an embodiment of the ohmic metal structure for GaN device of the present invention. In current embodiment, the diffusion barrier seed layer 3 is made of Pt. The plurality of metal layers 4 comprises the first metal layer 40, the second metal layer 41, the third metal layer 42 and the fourth metal layer 43. The first metal layer 40, the second metal layer 41, the third metal layer 42 and the fourth metal layer 43 are made of Ti, Al, Ni and Au respectively. The rapid thermal annealing temperature of the rapid thermal annealing process is greater than or equal to 800° C. and less than or equal to 925° C. The rapid thermal annealing time of the rapid thermal annealing process is 60 seconds. Comparing to the top surface of the ohmic metal (Ti/Al/Ti/Au) for GaN device of conventional technology in FIG. 6A, the top surface of the ohmic metal structure 1 for GaN device of the present invention in FIG. 4A is obviously very smooth and uniform. Please also refer to FIG. 4B, which is the partial enlarged view of the SEM image of the embodiment of FIG. 4A. Comparing to the ohmic metal (Ti/Al/Ti/Au) for GaN device of conventional technology in FIG. 6B, the ohmic metal structure 1 for GaN device of the present invention in FIG. 4B is obviously more smooth and uniform and has no protrusion or depression. Please also refer to FIG. 4C, which is the partial enlarged view of the SEM image of the embodiment of FIG. 4A. Comparing to the ohmic metal (Ti/Al/Ti/Au) for GaN device of conventional technology in FIG. 6C, the ohmic metal structure 1 for GaN device of the present invention in FIG. 4C has no protrusion beyond the edge of the ohmic metal. Furthermore, please refer to FIG. 4D, which is the cross-sectional view of the TEM image of another embodiment of the ohmic metal structure for GaN device of the present invention. In current embodiment, FIG. 4D shows the partial cross-sectional view of the GaN field effect transistor having the ohmic metal structure 1 of the present invention. The diffusion barrier seed layer 3 is made of Pt. The plurality of metal layers 4 comprises the first metal layer 40, the second metal layer 41, the third metal layer 42 and the fourth metal layer 43. The first metal layer 40, the second metal layer 41, the third metal layer 42 and the fourth metal layer 43 are made of Ti, Al, Ni and Au respectively. The rapid thermal annealing temperature of the rapid thermal annealing process is greater than or equal to 800° C. and less than or equal to 925° C. The rapid thermal annealing time of the rapid thermal annealing process is 60 seconds. In current embodiment, the breakdown voltage of the GaN field effect transistor having the ohmic metal structure 1 of the present invention is effectively increased to 160V~180V. Therefore, it is very suitable for a high energy density GaN field effect transistor application. Comparing to the ohmic metal (Ti/Al/Mo/Au) for GaN device of conventional technology in FIGS. 7B, 7C, 7D, 7E, 7F and 7G, the ohmic metal structure 1 for GaN device of the present invention in FIG. 4D has a smooth and uniform top surface. The ohmic metal structure 1 has no ohmic metal spiking phenomenon. Please also refer to FIG. 4E, which is the partial enlarged view of the SEM image of the white block region of the embodiment of FIG. 4D. Comparing to the ohmic metal (Ti/Al/Ti/Au) for GaN device of conventional technology in FIGS. 6D, 6E and 6F, the ohmic metal structure 1 for GaN device of the present invention in FIG. 4E has no tumor at the edge. Therefore, the ohmic metal structure 1 for GaN device of the present invention indeed can significantly increase the breakdown voltage of the GaN device. By providing the diffusion barrier seed layer 3, so as to suppress the diffusion of the plurality of metal layers 4 into the epitaxial structure layer 2. The top surface of the ohmic metal structure 1 is smooth and uniform. The ohmic metal spiking phenomenon is prevented. There is no tumor at the edge of the ohmic metal structure 1. The breakdown voltage of the GaN field effect transistor having the ohmic metal structure 1 for GaN device of the present invention is significantly increased.

As disclosed in the above description and attached drawings, the present invention can provide an ohmic metal structure for GaN device. It is new and can be put into industrial use.

Although the embodiments of the present invention have been described in detail, many modifications and variations may be made by those skilled in the art from the teachings disclosed hereinabove. Therefore, it should be understood that any modification and variation equivalent to the spirit of the present invention be regarded to fall into the scope defined by the appended claims.

What is claimed is:

1. An ohmic metal structure for GaN device comprises: a diffusion barrier seed layer formed on a semiconductor structure layer, wherein said diffusion barrier seed layer is in contact with said semiconductor structure layer, wherein said diffusion barrier seed layer is made of Pt, wherein said semiconductor structure layer is made of one material selected from the group consisting of: GaN and AlGaN; and a plurality of metal layers formed on said diffusion barrier seed layer, wherein said plurality of metal layers comprises: a first metal layer formed on said diffusion barrier seed layer, wherein said first metal layer is made of Ti; a second metal layer formed on said first metal layer, wherein said second metal layer is made of Al; wherein said GaN device is a GaN high electron mobility transistor; wherein said ohmic metal structure forms an n-type ohmic contact with said semiconductor structure layer, wherein said diffusion barrier seed layer has a thickness greater than or equal to 50 Å and less than or equal to 250 Å.

2. The ohmic metal structure for GaN device according to claim 1, wherein said plurality of metal layers further comprise a third metal layer, wherein said third metal layer is formed on said second metal layer, wherein said third metal layer is made of one material selected from the group consisting of: Ni, Mo, Pd, Pt and Ti.

3. The ohmic metal structure for GaN device according to claim 2, wherein said plurality of metal layers further comprise a fourth metal layer, wherein said fourth metal layer is fondled on said third metal layer, wherein said fourth metal layer is made of Au.

4. The ohmic metal structure for GaN device according to claim 3, wherein said fourth metal layer has a thickness greater than or equal to 100 Å and less than or equal to 1000 Å.

5. The ohmic metal structure for GaN device according to claim 2, wherein said third metal layer has a thickness greater than or equal to 400 Å and less than or equal to 800 Å.

6. The ohmic metal structure for GaN device according to claim 1, wherein said second metal layer has a thickness greater than or equal to 500 Å and less than or equal to 1500 Å.

7. The ohmic metal structure for GaN device according to claim 1, wherein said first metal layer has a thickness greater than or equal to 50 Å and less than or equal to 250 Å.

* * * * *